United States Patent

Issler

[11] Patent Number: 6,147,641
[45] Date of Patent: Nov. 14, 2000

[54] PROCESS FOR THE AUTONOMOUS REDUCTION OF ACQUISITION AND TRACKING THRESHOLDS OF CARRIERS RECEIVED IN ORBIT

[75] Inventor: Jean-Luc Issler, St Orens, France

[73] Assignee: Centre National d'Etudes Spatiales, Paris, France

[21] Appl. No.: 08/945,808

[22] Filed: Nov. 12, 1997

[30] Foreign Application Priority Data

Mar. 12, 1996 [FR] France .................................. 96 03079

[51] Int. Cl.$^7$ .................................................. H04B 7/185

[52] U.S. Cl. ....................................... 342/357.05; 342/352

[58] Field of Search ............................... 342/352, 357.06, 342/418, 357.05, 402; 701/213

[56] References Cited

U.S. PATENT DOCUMENTS

| | | | |
|---|---|---|---|
| 3,713,149 | 1/1973 | Brunner et al. | 343/7 A |
| 3,878,522 | 4/1975 | Gurak et al. | 343/117 |
| 5,691,974 | 11/1997 | Zehavi et al. | 370/203 |

*Primary Examiner*—Thomas H. Tarcza
*Assistant Examiner*—Dao L. Phan
*Attorney, Agent, or Firm*—Oblon, Spivak, McClelland, Maier & Neustadt, P.C.

[57] ABSTRACT

The present invention relates to a process for the autonomous reduction of acquisition and tracking thresholds of carriers received in orbit by a receiver accessing an orbital navigator inside or outside said receiver, the latter having at least one phase loop. The phase loop, which is responsible for the acquisition and/or tracking of the carrier, is "pushed" by the fine speed aid and takes up the error between the real speed and the calculated speed. The search for the Doppler frequency of the carrier received takes place around a frequency prediction maintained by the fine speed aid coming from the orbital navigator.

4 Claims, 4 Drawing Sheets

PROCESS FOR THE AUTONOMOUS REDUCTION OF ACQUISITION AND TRACKING THRESHOLDS OF CARRIERS RECEIVED IN ORBIT

DESCRIPTION

1. Technical Field

The invention relates to a process for the autonomous reduction of acquisition and tracking thresholds of carriers received in orbit.

2. Prior Art

The invention combines three basic components, namely a radio signal receiver, an airborne orbit determination filter and a threshold reduction procedure by precise radial speed aid. Each of these three components will now be considered.

The receiver can be any random radio equipment carried by a satellite (references [1], [2], [5]). The signals received can be emitted or transmitted by other orbiting satellites or from fixed points on the ground. In exemplified manner, these receivers can be of the following types:

GPS, GLONASS, GNSS1, GNSS2 receiver, transponder,

DORIS NG receiver, narrow band DORIS receiver.

The GPS and GLONASS satellite constellations are respectively described in documents [3] and [4].

GNSS1 designates the geostationary compliments to GPS and/or GLONASS using navigation payloads of INMARSAT 3 satellites. GNSS2 designates the future "civil" constellation of navigational satellites.

Narrow band DORIS stands for a global radio location and radio navigation system from CNES (Centre National d'Etudes Spatiales).

The signals transmitted by the system are in the narrow band.

DORIS NG designates a global space radio location and radio navigation system project, based on the use of spread spectrum signals transmitted by beacons on the ground and received by orbiting satellites.

The orbit determination filter is a digital processing, e.g. located in the receiver. It uses approximate measurements made by the latter, i.e. pseudospeed measurements relative to radio signal emitters (on the ground or in orbit). These measurements can optionally be supplemented by pseudodistance measurements processed with the aid of the modulation of the carriers received. These measurements are processed for determining in an autonomous manner the orbital parameters and/or the position and speed of the carrier satellite. The definition of these measurements is given in document [5]. The filter can be of the following types, given in exemplified manner:

Kalman filter (cf. document [6]), simple least squares filter, recursive least squares filter.

This filter is also able to determine the following parameters:

$V_i = D_i$ = radial speed between the satellite and emitter i, $\Delta T_i$ = relative drift between the clock of emitter i and the receiver clock.

Thus, the filter can estimate pseudospeeds $PV_i$:

$PV_i = V_i + C \cdot \Delta T_i$.

The aforementioned quantities can be estimated even if the signals coming from emitter i are not processed by the receiver and the associated navigational filter, provided that the position, speed and clock coefficients of said emitter can be estimated or are known. The orbital navigator estimates these pseudospeeds with the precision PV.

The orbital navigator can receive remote controls describing the manoeuvres of the carrier satellite. These manoeuvres can be described by the parameters $\Delta Vx(t0)$; $\Delta Vy(t0)$ and $\Delta Vz(t0)$, where $\Delta V_i$ represent the components of the speed pulse at t0.

The manoeuvres are described with a precision designated $\delta Vx$, $\delta Vy$, $\delta Vz$ for the three axes. The global precision of the description of the manoeuvre is $\delta V$ with:

$$\delta V = \sqrt{\delta V_x^2 + \delta V_y^2 + \delta V_z^2}$$

The procedure of threshold reduction by a precise radial speed or radial pseudospeed aid is applicable to the case of receivers equipped with one or more phase loops. It is assumed that these loops are produced with digital technology.

When the signal is received with a ratio C/No lower than the conventional aided acquisition mode locking or synchronizing threshold, the digitally controlled oscillator (OCN) of the carrier loop is controlled by an external radial speed or pseudospeed prediction. The conventional aided acquisition mode locking is illustrated in document [1].

This speed prediction must be fine and comes from a sensor different from the receiver. For example, said sensor is typically an inertial unit.

Such a procedure can also be used for tracking carriers of GPS signals with a low equivalent C/No ratio received by GPS receivers interfaced with inertial units, supplying a fine speed aid to said receivers.

The invention relates to a process for the autonomous reduction of the acquisition and tracking thresholds of carriers received in orbit.

DESCRIPTION OF THE INVENTION

The invention relates to a process for the autonomous reduction of acquisition and tracking thresholds of carriers received in orbit by a receiver accessing an integrated orbital navigator inside or outside said receiver, characterized in that the receiver has a phase loop, which is responsible for the acquisition and/or tracking of the carrier and is "pushed" by the speed aid and takes up the error between the real pseudospeed and the calculated pseudospeed, the search of the Doppler frequency of the received carrier taking place about a frequency prediction maintained by the fine speed aid coming from the orbital navigator.

The process according to the invention comprises the following stages:

the receiver receives the necessary aids for conventional aided acquisition enabling the receiver to lock on all the signals with a ratio C/No such that $C/No > (C/No)_a$, $(C/No)_a$ being the conventional aided acquisition mode locking threshold;

a reduction takes place to the thresholds of the carriers to the value $(C/No)_{avf}$, $(C/No)_{avf}$ being the locking threshold of the carriers in the acquisition mode aided by a fine speed aid, which comes from the orbital navigator.

Said process can have a preliminary stage during which the receiver starts cold without any aid or external or internal message and locks on all the signals with a ratio C/No such that: $C/No \geq (C/No)_{na}$, $(C/No)_{na}$ being the unaided mode locking threshold. In this case, there is a total receiver autonomy.

In the case of a manoeuvre dedicated to the control of the satellite orbit, the orbital navigator receives the description of said manoeuvres and updates the speed aid supplied by the navigator. In order that the locking of the carriers received with small C/No ratios is still possible in the case of a manoeuvre, the following condition must be respected to the first order:

$$(\delta PV + \delta V) < \frac{B}{f_i} \times C$$

in which δPV is the uncertainty on the prediction on the pseudospeed supplied by the navigator in the absence of a manoeuvre, where δV is the precision on the description of the manoeuvre, B is the analysis band, C the speed of light and $f_i$ the frequency of the carrier signal transmitted by the emitter i.

When a carrier modulated by data is tracked with a ratio C/No such that: $(C/No)_{avf} < C/No < (C/No)_a$, the updatings of the characteristic parameters of the emitters can be communicated to the receiver with the aid of external remote controls if this proves necessary, in the case where the demodulation of said data is impossible.

The process of the invention consists of reducing the acquisition and tracking thresholds of the carriers by receivers for satellites equipped with an airborne orbit determination filter. This threshold reduction takes place in an autonomous manner by said receivers using the invention. This threshold reduction can be significant.

DETAILED DESCRIPTION OF EMBODIMENTS

Figure 1:
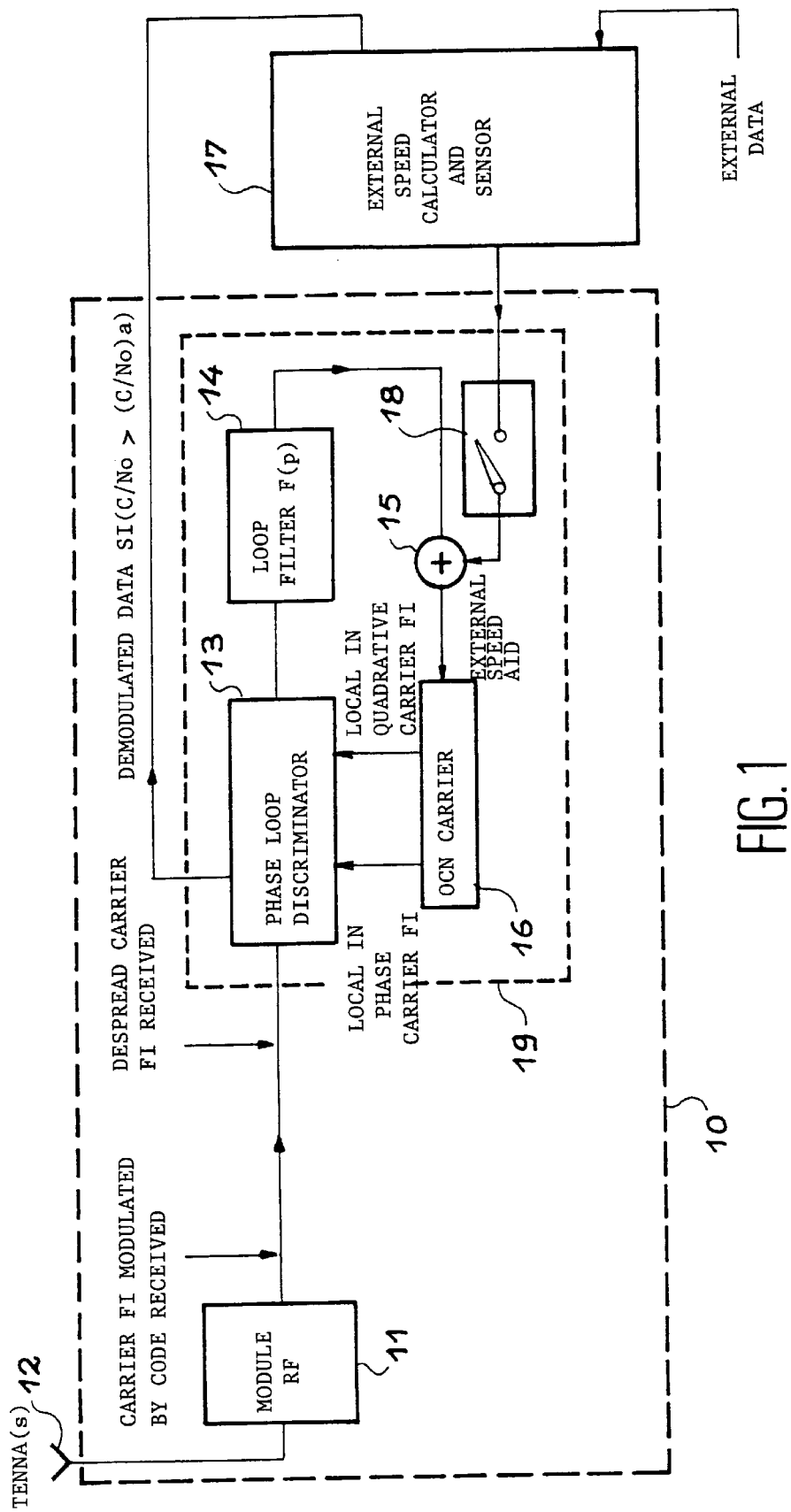
FIG. 1 illustrates a block diagram of a receiver having a threshold reduced by an external fine speed aid according to the invention.

FIG. 1 illustrates a spread spectrum receiver having a threshold reduced by external fine speed aids and where only the basic architecture of the digital processing is shown.

This receiver 10 has at least one RF module 11 connected to at least one antenna 12, whose output signal is connected to a discriminator 13 of the phase loop followed a loop filter 14 and an adder 15. A carrier OCN (digitally controlled oscillator) module 16 transmits a local carrier $F_i$ in phase (and in quadrature in certain cases) to the discriminator 13 and is connected to the output of the adder 15. The discriminator 13 can integrate a predetection filter. The switch 15 also receives a signal from an external speed calculator and sensor means 17 (e.g. inertial unit), across a switch 18. The switch 18 is switched off again when the carrier loop 19 requires the external fine speed aid for locking and/or tracking the carriers received.

Tracking

The phase loop responsible for tracking the carriers is "pushed" by the speed aid. In other words, the OCN of said loop varies the phase of the local carrier with a speed equal to the external speed prediction. The thus "pushed" phase loop takes up the error between the real speed and the calculated speed.

The order of said loop must be adequate to keep the OCN slaved, which makes it possible to produce pseudospeed measurements with the aid of a Doppler counter.

Acquisition

The phase loop responsible for the acquisition of carriers is also "pushed" by the fine speed aid. The Doppler frequency search of the carrier received takes place about a frequency prediction (fine Doppler prepositioning) maintained by the external speed aid.

The frequency search area of the carrier received is smaller than in the case of a conventional aid mode acquisition. Thus, the principle described functions if the uncertainty of the Doppler prediction $\Delta F_D$ is below an analysis band B.

Thus, the uncertainty δPV on the pseudospeed prediction must respect the following relations:

$$\Delta F_D < B \quad \text{i.e.:} \quad \delta PV < \frac{B}{f_i} \times C$$

where C is the speed of light and $f_i$ the frequency of the carrier signal transmitted by the emitter i.

Thus, as the Doppler uncertainty areas are smaller than in conventional cases, the energy search can take place with a much slower local carrier scanning speed than in conventional cases for the same search time T. Therefore the acquisition threshold is reduced.

The following C/No ratios are defined:

$(C/No)_{na}$=aided mode locking threshold, $(C/No)_a$=conventional aided acquisition mode locking threshold, $(C/No)_{avf}$=locking threshold of carriers in the acquisition mode aided by a fine speed aid.

The definition of the thresholds $(C/No)_{na}$ and $(C/No)_a$ is described in document [1]. The threshold $(C/No)_{avf}$ is a function of several parameters:

$(C/No)_{avf}$=g/T; δPV;B).

The invention is characterized by the following process, performed in a satellite spread spectrum receiver equipped with an orbital navigator.

Stage 1 (Optional)

The receiver starts cold (with no aid or external or internal message). It locks all the signals with a ratio C/No such that:

C/No ≥ (C/No)$_{na}$

The first locked signals can optionally enable the receiver to receive messages making it possible to determine the position and/or the speed and/or the clock coefficients of the emitters i and bring about convergence of the orbital navigator, with the aid of first pseudospeed measurements performed and the associated datings.

This first stage is necessary for entirely autonomous space missions.

Stage 2

The receiver receives the aids necessary for conventional aided acquisition. These aids are not very precise and of the type:

1) date and time of receiver clock,
2) positions/speeds (or optionally orbital parameters) of emitters,
3) position/speed or orbital parameters of carrier satellite.

These aids can wholly or partly come from stage 1. In this case they are within the receiver (e.g. positions/speeds of emitters can be transmitted by said emitters). The autonomy function is maintained.

In the case where all or part of said approximate aids is communicated to the receiver by the bias of external remote controls, same is not entirely autonomous.

In the case where stage 1 is not performed, said aids are necessarily outside the receiver.

These approximate aids enable the receiver to lock on all the signals with a ratio C/No such that:

$$C/No > (C/No)_a$$

The number of pseudospeed measurements then increases compared with the case of stage 1, because:

$$(C/No)_a < (C/No)_{na}.$$

The number of said measurements is assumed to be adequate to bring about convergence of the orbital navigator supplying the orbital parameters of the carrier satellite with a precision better than in stage 1.

Stage 3

When stage 2 has been performed, it is assumed that the precision of the output parameters of the orbital navigator and the characteristic parameters of the emitters is compatible with the efficiency of the speed aid required in order to further reduce the locking thresholds of the carriers to the value $(C/No)_{avf}$.

Figure 2:
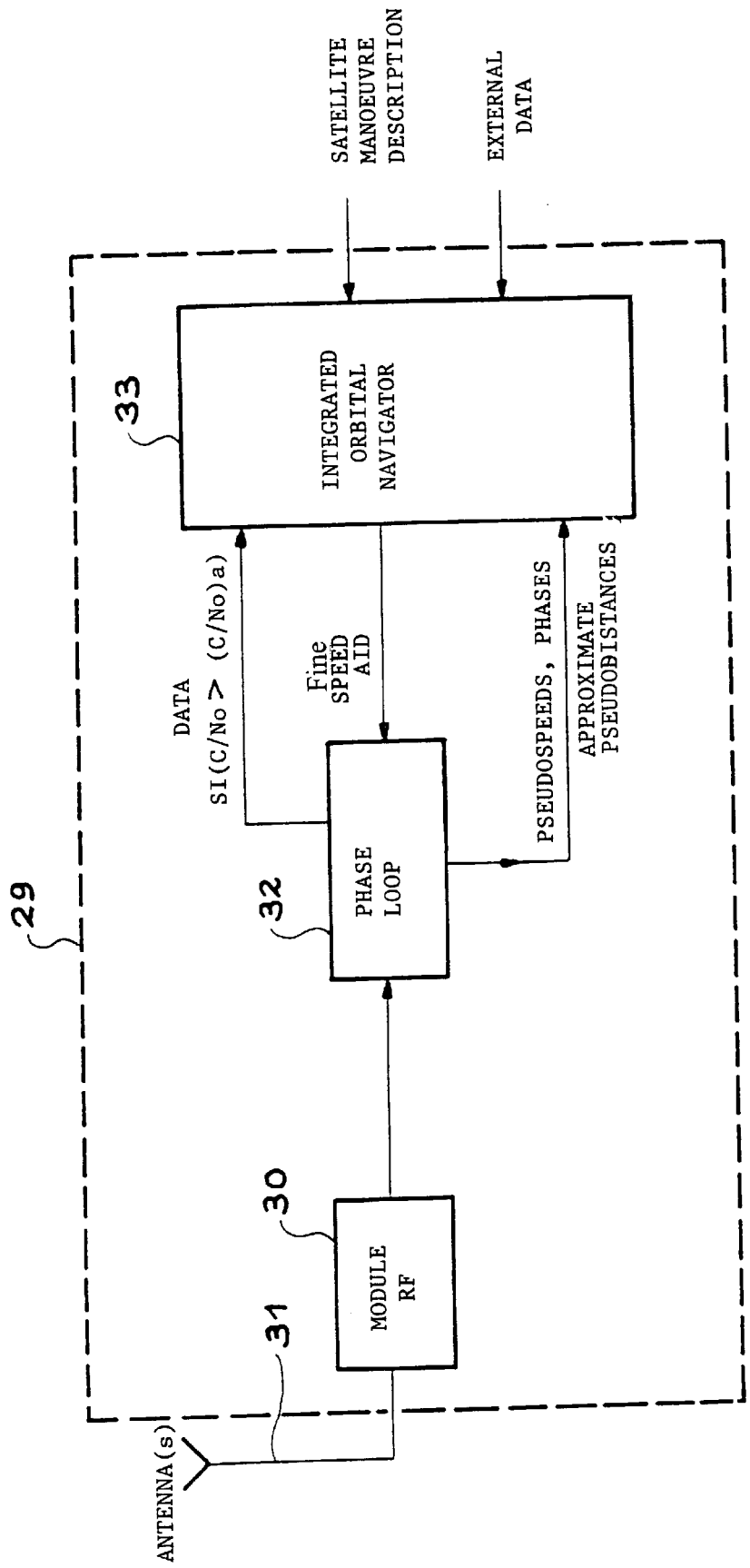
FIG. 2 illustrates a block diagram of a receiver integrating the device according to the invention.

Unlike in the prior art, the fine speed aid comes from the orbital navigator integrated in the receiver. Therefore said aid is internal and autonomy is maintained, as shown in FIG. 2.

Therefore the navigator precision can be further improved. Moreover, in the case of a progressive deterioration of the link budget with the emitters, the deterioration of said precision can be limited, so as to give:

$$C/No_{avf} < (C/No)_a$$

Stage 4

In the case of a manoeuvre dedicated to the orbit control of the satellite, the orbital navigator receives the description of said manoeuvres and updates the speed aid supplied by the navigator.

In order to ensure that the locking of the pseudorandom codes received with small C/No ratios is always possible in the case of manoeuvres, the following condition must be respected to the first order:

$$(\delta PV + \delta V) < \frac{B}{f_i} \times C$$

where $\delta PV$ is the prediction on the pseudospeed supplied by the navigator in the absence of a manoeuvre and $\delta V$ is the precision on the description of the manoeuvre.

Stage 5

When a pseudorandom code is tracked with a ratio C/No such that:

$$(C/No)_{avf} < C/No < (C/No)_a$$

the demodulation of the data of the message transmitted by the emitters is not always possible.

In the latter case, the updatings of the characteristic parameters of the emitters (positions and/or speeds and/or clock coefficients) must therefore be communicated to the receiver with the aid of external remote controls, should this prove necessary. For example, in the case of a GPS or GLONASS receiver, said parameters can be ephemerides of the constellation used.

FIG. 2 illustrates a radio signal receiver 29 for satellites having at least one RF module 30 receiving a signal from at least one antenna 31, connected to at least one phase loop 32.

An integrated orbital navigator 33 receives from the phase loop data if $(C/No) > (C/No)_a$. This navigator supplies a fine speed aid to the phase loop.

Figure 3:
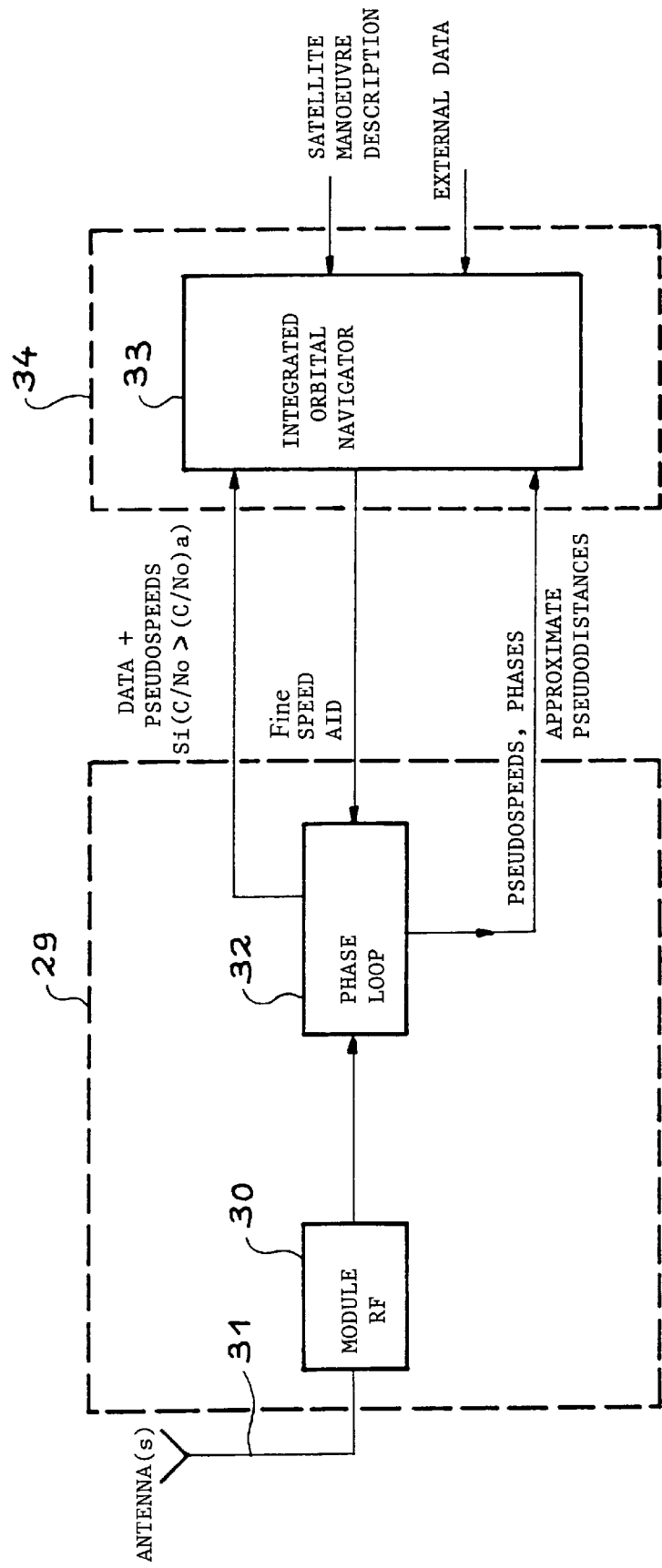
FIG. 3 illustrates a variant of the invention.

The integrated orbital navigator receives the description of satellite manoeuvres and external data. FIG. 3 illustrates a variant according to the invention, where the orbital navigator is integrated into an airborne computer 34 carried by the satellite.

Figure 4:
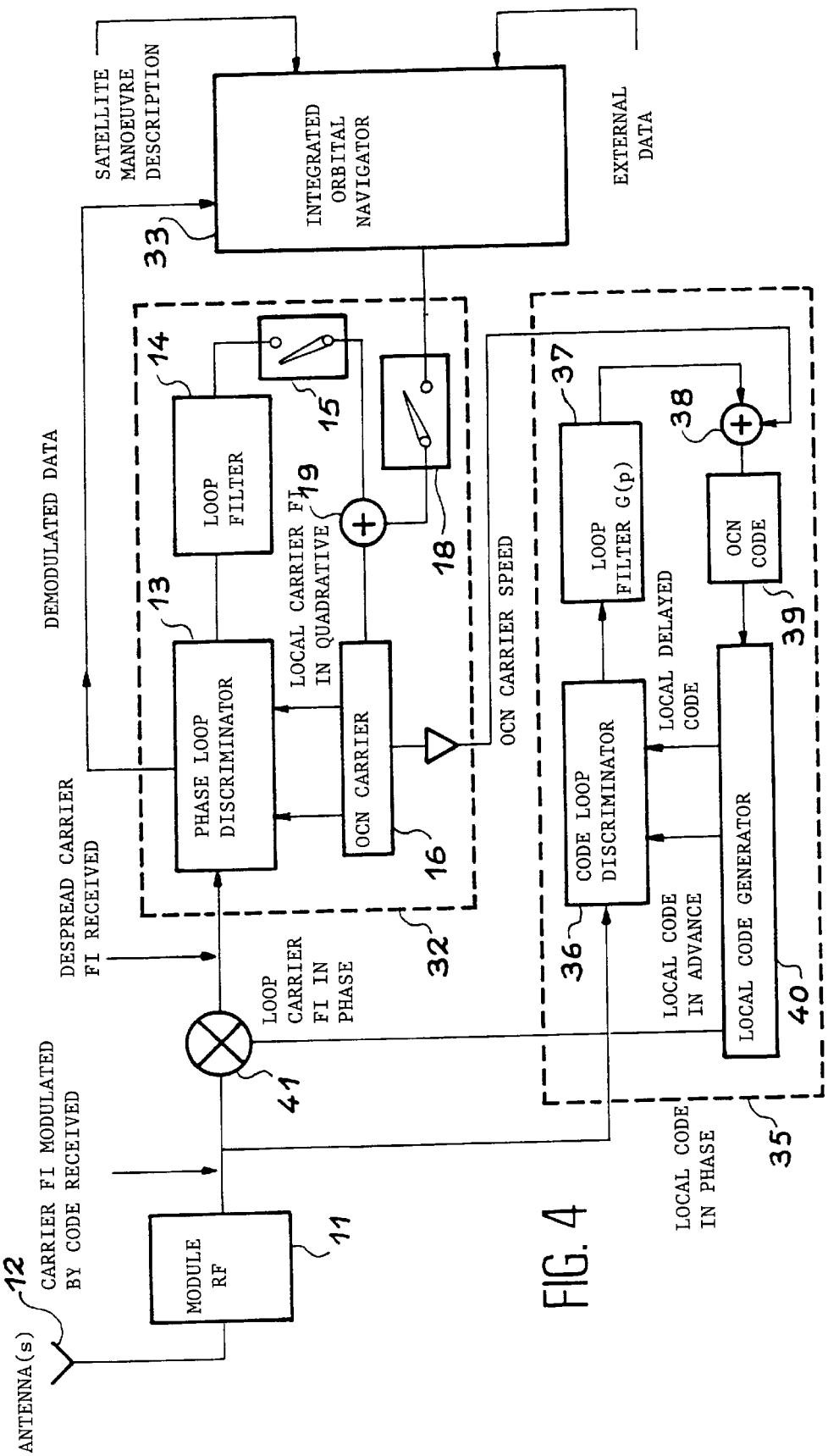
FIG. 4 illustrates the application of the invention in the case of a spread spectrum signal receiver.

FIG. 4 illustrates an example according to the invention, where the receiver 29 can process spread spectrum signals.

The receiver 29 has at least one phase loop 32 and at least one code loop 35. The phase loop 32 incorporates a switch 19 placed between the loop filter F(p) 14 and the adder 15.

The code loop incorporates a discriminator 36, receiving the carriers modulated by the pseudorandom codes received, coming from a RF module 11. This discriminator can integrate a predetection filter. The output of said discriminator is connected to a loop filter G(P) 37. An adder 38 receives the output of the filter 37 and the carrier OCN speed signal supplied by the carrier OCN 16. The output of said adder is connected to an OCN code 39, which is itself connected to a local code generator 40.

The generator 40 is connected on the one hand to a correlator 41 and supplies to it the local code in phase and on the other to the discriminator 36 and supplies to it the local code in advance and the local code with a delay. The phase loop discriminator 13 is connected to the correlator 41.

The code loop 35 receives a fine speed aid from the NCO carrier 16. The switch 18 is switched off if the carrier loop requires a fine speed aid from the integrated orbital navigator 33 in order to function in the carrier tracking and/or locking mode.

The switch 18 remains off if C/No<(C/No)avf. In this case, the carrier loop can neither acquire, nor track the carrier and the switch 19 is on. The tracking loop consequently directly supplies the fine speed aid from the navigator 33 to the code loop 35.

EXAMPLES OF APPLICATION

The applications of the process according to the invention concerning the reception of carriers on board satellites relate to unfavourable link budget conditions between the emitters used and said satellites. For example, these applications can be:

From the Standpoint of the Receiver Types

Navigation with the aid of a satellite constellation receiver (such as GPS, GLONASS).

Navigation with the aid of a spread spectrum transponder. The link budget can be unfavourable at the start and end of overlfying a remote control/telemetry (TM/TC) station, or at the start and end of passage of a relay satellite such as TDRSS.

Navigation with the aid of the narrow band DORIS receiver.

Navigation with the aid of a spread spectrum signal receiver transmitted by a group of beacons on the ground, equipped with a hemispherical diagram antenna. The power transmitted by these beacons is assumed to be optimized for a use by low orbit satellites. The link budget is consequently assumed to be less favourable for a satellite e.g. in a geostationary orbit.

Attitude detection with the aid of a satellite constellation receiver (such as GPS, GLONASS) or spread spectrum signals transmitted by a group of beacons on the ground (such as DORIS NG). The number of interferometric measurements obtained with the aid of carriers received for C/No≧(C/No)a is not necessarily adequate for attitude detection applications. The acquisition and/or tracking of carriers received for C/No≧(C/No)avf can prove necessary in certain cases.

From the Standpoint of Orbits

Navigation with the aid of a GPS or DORIS NG receiver for certain geostationary transfer orbits, which can be of the following types:

conventional geostationary transfer orbit (OTG), supersynchronous orbit (OSPS), subsynchronous orbit (OSBS), drift orbit (ODD).

These navigations can take place with at least two low gain antennas, if the signal locking threshold is low (cf. document [7]).

Navigation with the aid of a high apogee orbiting receiver which can be of the following exemplified types (cf. document [8]):

Molniya orbit,

Tundra orbit,

Archimedes orbit.

Navigation with a circular orbiting receiver for a navigation satellite constellation with a period of approximately 12 hours. The reception of hemispherical antenna ground beacons is adapted thereto.

Navigation with the aid of a low orbiting receiver, connected to one or more low cost reception antennas, which are consequently not optimized, but sufficiently good to enable the receiver to perform stage 2 according to the invention.

DOCUMENT REFERENCES

[1] "Orbital Navigation with a GPS Receiver on the HETE Spacecraft" (ION GPS January 94, pp 645–656)

[2] "ESA Dual-Standard S-Band Transponder: A Versatile TT&C Equipment for Communications via a Data Relay Satellite or Directly with the Ground Network" by J. L. Gerner (42nd Congress of The International Astronautical Federation, Oct. 5–11 1991)

[3] "Standardization Agreement; characteristics of the global position determination system NAVSTAR (GPS)" (OTAN, STANAG 4294)

[4] "GLONASS Approaches Full Operational Capability (FOC)" by P. Daly (ION GPS, September 1995)

[5] "Module 6 Space Vehicle Technologies and Procedures—space location"; (Editions Cepadues)

[6] "Low-Orbit Navigation Concepts" by H. James Rome (vol. 35, No. 3, Fall 1988, pp 371–390)

[7] "GPS Techniques for Navigation of Geostationary Satellites" by P. Ferrage, J. L. Issler, G. Campan and J. C. Durand (ION GPS, Sep. 12–15 1995)

[8] "Applicability of GPS-Based Orbit Determination Systems to a Wide Range of HEO Missions" by J. Potti, P. Bernedo and A. Pasetti (ION GPS, Sep. 12–15 1995)

What is claimed is:

1. A method for autonomously reducing at least one of an acquisition threshold and a tracking threshold of a carrier received in orbit by a receiver on a satellite accessing an on-board orbital navigator, comprising the steps of:

receiving the carrier by the receiver;

generating a fine speed aid on-board the satellite with a calculated speed from the on-board orbital navigator;

pushing a phase loop with the fine speed aid so as to reduce an error between a real speed and the calculated speed; and performing a Doppler frequency search for the carrier around a frequency prediction provided by the fine speed aid.

2. The method of claim 1, further comprising the step of:

prior to the receiving step, providing the receiver with acquisition aids including (i) a date and a time of a receiver clock, (ii) a position/speed or orbital parameters of an emitter, and (iii) a position/speed or orbital parameters of the satellite, wherein, the acquisition threshold is reduced to below a conventional aided acquisition threshold.

3. The method of claim 2, further comprising the steps of:

receiving a description of a maneuver that is dedicated to an orbit control of the satellite, wherein the description of the maneuver satisfies the equation $$(\delta PV + \delta V) < \left(\frac{B}{f_i}\right) \times C$$

where $\delta PV$ is a precision of the fine speed aid, $\delta V$ is a precision of the description of the maneuver, B is an analysis band, $f_i$ is a frequency of the carrier received, and C is a speed of light; and updating the fine speed aid to account for the maneuver.

4. The method of claim 2, wherein:

the providing step comprises providing the receiver with acquisition aids through an external remote control.

* * * * *

UNITED STATES PATENT AND TRADEMARK OFFICE
CERTIFICATE OF CORRECTION

PATENT NO. : 6,147,641
DATED : November 14, 2000
INVENTOR(S) : Jean-Luc Issler

It is certified that error appears in the above-identified patent and that said Letters Patent is hereby corrected as shown below:

On the title page,
Item [22] is incorrect and items [86] and [87] have been omitted. The PCT information should read as follows:

--[22] PCT Filed:        Mar. 11, 1997
  [86] PCT No:           PCT/FR97/00424
       §371 Date:        Nov. 12, 1997
       §102(e) Date:     Nov. 12, 1997
  [87] PCT Pub. No.:     WO97/34162
       PCT Pub. Date:    Sep. 18, 1997--

--Also--

Column 1,
First paragraph, the PCT information has been omitted. The paragraph should read as follows:

— This Application is a 371 of PCT/FR97/00424, filed March 11, 1997.--

Signed and Sealed this

Nineteenth Day of June, 2001

*Attest:*

Nicholas P. Godici

NICHOLAS P. GODICI
*Acting Director of the United States Patent and Trademark Office*

*Attesting Officer*